United States Patent
Yang et al.

(10) Patent No.: US 10,381,263 B1
(45) Date of Patent: Aug. 13, 2019

(54) METHOD OF FORMING VIA CONTACT WITH RESISTANCE CONTROL

(71) Applicant: International Business Machines Corporation, Armonk, NY (US)

(72) Inventors: Chih-Chao Yang, Glenmont, NY (US); Theodorus E Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/971,783

(22) Filed: May 4, 2018

(51) Int. Cl.
| | |
|---|---|
| *H01L 21/4763* | (2006.01) |
| *H01L 21/768* | (2006.01) |
| *H01L 23/522* | (2006.01) |
| *H01L 21/3213* | (2006.01) |
| *H01L 21/311* | (2006.01) |

(52) U.S. Cl.
CPC .. *H01L 21/76807* (2013.01); *H01L 21/31144* (2013.01); *H01L 21/32137* (2013.01); *H01L 21/76805* (2013.01); *H01L 21/76816* (2013.01); *H01L 21/76843* (2013.01); *H01L 21/76849* (2013.01); *H01L 21/76852* (2013.01); *H01L 21/76877* (2013.01); *H01L 23/5226* (2013.01)

(58) Field of Classification Search
CPC ......... H01L 21/76805; H01L 21/31144; H01L 21/76816; H01L 21/32137; H01L 23/5226; H01L 21/76849; H01L 21/76807; H01L 21/76843; H01L 21/76877; H01L 23/5283; H01L 23/53228; H01L 23/528; H01L 21/76852
See application file for complete search history.

(56) References Cited

U.S. PATENT DOCUMENTS

| | | | |
|---|---|---|---|
| 4,918,500 | A | 4/1990 | Inuishi |
| 5,891,513 | A | 4/1999 | Dubin |
| 6,022,796 | A | 2/2000 | Berry |
| 6,143,645 | A | 11/2000 | Hsu |

(Continued)

FOREIGN PATENT DOCUMENTS

| | | | |
|---|---|---|---|
| CN | 105470225 A | | 4/2016 |
| KR | 20050002028 A | | 1/2005 |

(Continued)

OTHER PUBLICATIONS

IBM Patents or Patent Applications Treated as Related.
Method of Etching Cu in High Aspect Ratio Geometry, Disclosed Anonymously, IPCOM000245402D Mar. 7, 2016.

*Primary Examiner* — Shouxiang Hu
(74) *Attorney, Agent, or Firm* — Jeffrey S LaBaw; Steven J Meyers

(57) ABSTRACT

A first dielectric layer on a substrate is provided. The first dielectric layer has a first level metal line embedded in the dielectric. An opposite gouging feature is created in a top surface of the first level metal line. The opposite gouging feature has a protuberant shape relative to the first level metal line. A second dielectric layer is formed over the first dielectric layer. A compound recess is formed in the second dielectric layer. A first portion of the recess is for a via connector positioned over the opposite gouging feature. A second portion of the recess for a second level metal line. In another aspect of the invention, a device is produced using the method.

9 Claims, 11 Drawing Sheets

(56) References Cited

U.S. PATENT DOCUMENTS

| | | | |
|---|---|---|---|
| 6,440,842 B1 * | 8/2002 | Chang | H01L 21/76807 |
| | | | 257/E21.579 |
| 7,086,138 B2 | 8/2006 | Anderson | |
| 7,727,888 B2 | 6/2010 | Yang | |
| 7,781,892 B2 | 8/2010 | Chen | |
| 8,232,196 B2 | 7/2012 | Yang | |
| 8,492,874 B2 | 7/2013 | Lan | |
| 8,569,816 B2 | 10/2013 | Shroff | |
| 8,759,212 B2 * | 6/2014 | Kume | H01L 21/02126 |
| | | | 438/623 |
| 9,337,195 B2 | 5/2016 | Lin | |
| 9,786,550 B2 | 10/2017 | Gates | |
| 2002/0121699 A1 | 9/2002 | Cheng | |
| 2003/0003717 A1 * | 1/2003 | Park | H01L 21/31116 |
| | | | 438/638 |
| 2003/0068867 A1 | 4/2003 | Forster | |
| 2007/0164434 A1 | 7/2007 | Watanabe | |
| 2007/0264770 A1 | 11/2007 | Lee | |
| 2010/0219533 A1 * | 9/2010 | Ootake | H01L 21/76808 |
| | | | 257/773 |
| 2012/0193760 A1 | 8/2012 | Manabe | |
| 2014/0327109 A1 | 11/2014 | Weng | |
| 2016/0358859 A1 | 12/2016 | Murray | |
| 2017/0263557 A1 | 9/2017 | Clevenger | |

FOREIGN PATENT DOCUMENTS

| | | |
|---|---|---|
| KR | 20060061039 A | 6/2006 |
| KR | 100842466 B1 | 6/2008 |

\* cited by examiner

METHOD OF FORMING VIA CONTACT WITH RESISTANCE CONTROL

BACKGROUND OF THE INVENTION

This disclosure relates to integrated circuit devices, and more specifically, to a method and structure to improve the conductivity of via structures in semiconductor devices.

In semiconductor circuits, it is common to connect the devices fabricated in or on a semiconductor substrate with a metallic interconnection structure made of metal lines and "vias" which interconnect the metal lines. Conventionally, the metal lines are arranged in horizontal layers, i.e. parallel to the substrate, and separated by layers of dielectrics while vias are disposed vertically in openings in the dielectric to interconnect the layers of metal lines. In such a structure, the bottoms of the vias are typically flat where they contact the upper surfaces of the underlying metal lines.

As the dimensions of the interconnection structure have become smaller, it has become a challenge to provide an adequate via contact. The contact resistance between the vias and metal lines has increased as the contact area between the vias and the metal lines has decreased due to the smaller diameter of the vias. In the prior art, a "via gouging" process has been adopted to achieve an adequate contact resistance. In the via gouging process, rounded or conical "gouges" are produced in the tops of the underlying metal lines. This has the effect of producing a rounded or conical bottom to the vias which descend lower than the top surface of the underlying metallurgy.

While the via gouging process is effective in improving contact resistance, the plasma sputtering typically used to produce the feature also damages the dielectric surface over which upper layers of metallurgy are deposited. This has the effect of degrading these metal layers and deleteriously affects the reliability of the interconnect structure, and therefore, the integrated circuit in which it is incorporated.

Thus, producing an improved via structure with improved conductivity without the damage caused by the via gouging process is desirable. The present disclosure presents a method and structure to address this problem.

BRIEF SUMMARY

According to this disclosure, an interconnect structure and a method for constructing the structure are described. A first dielectric layer on a substrate is provided. The first dielectric layer has a first level metal line embedded in the dielectric. An opposite gouging feature is created in a top surface of the first level metal line. The opposite gouging feature has a protuberant shape relative to the first level metal line. A second dielectric layer is formed over the first dielectric layer. A compound recess is formed in the second dielectric layer. A first portion of the recess is for a via connector positioned over the opposite gouging feature. A second portion of the recess for a second level metal line. In another aspect of the invention, a device is produced using the method.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
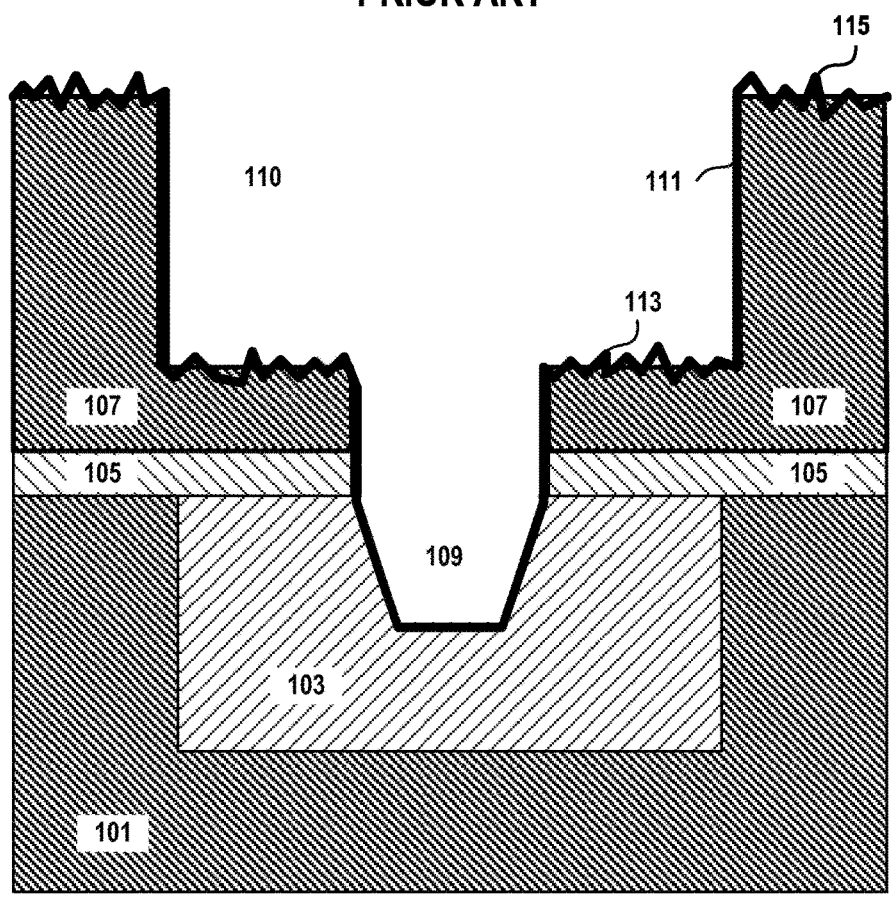
FIG. 1 is a cross-sectional diagram depicting a prior art structure produced by a via gouging process showing the dielectric surface roughening and degraded liner deposition produced by the process.

At a high level, embodiments of the invention provide an "opposite gouging feature" in an underlying metal line. The opposite gouging feature is a protuberant, convex or conical feature which is created in and protrudes upwards from the top surface of the metal line. The protuberant feature provides a greater contact area for a via connector than would a flat top surface of the metal line. The opposite gouging feature is so named because it forms a shape which is something of the opposite of the via gouge created by the prior art via gouging process. That is, the center portion of the feature is higher than the surrounding portions of the feature and has the most metal thickness of the feature. The greater contact area improves the conductance of the via to metal line interface and the overall interconnect structure.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. As discussed in the specification, the dielectrics are considered high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). Dielectrics with low dielectric constants, e.g., SiO2, have relative dielectric constants of 3.8 or below. Representative low-k dielectrics have dielectric constants equal or lower than 3.5. Example of low-k dielectrics include porous SiO2, and carbon doped SiO2. The dielectric can be a combination of two or more of these materials. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

"Electrically conductive" and/or "electrical conductor" as used through the present disclosure means a material typically having a room temperature resistivity less than about 400 µ Ω-cm. As used herein, the terms "insulator" and "dielectric" denote a material having a room temperature resistivity greater than about 400 µ Ω-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting a prior art dual Damascene structure produced by a via gouging process showing the dielectric surface roughening and degraded liner deposition produced by such a process. In a dielectric 101, a first level metal feature 103 is fabricated. Next, a capping layer 105 and an upper dielectric layer 107 are patterned for the via connection and second metal layer, providing via recess 109 and second metal layer recess 110 in which the via/second metal layer (not pictured) will be deposited.

Instead of a conventional flat via bottom, the prior art via gouging process creates a conical, truncated conical or rounded bowl-like shaped feature 109 in the underlying metal layer 103. For the purposes of the application, the prior art feature is called a "via gouge" feature. When the barrier layer 111 and via/second metal layer are deposited, they will conform to the shape of the via gouge feature 109. One effect of the via gouge features is to increase the surface area of the contact between the via contact and the underlying metal line, thereby improving the conductivity.

However, during the creation of the via gouging feature 109, the punch through process, not only removes metal, e.g., copper, from the underlining metal line, but also damages the exposed dielectric 107, which will result in poor/rough liner coverage 113 in the region of the damaged dielectric. Typically, a physical argon (Ar) plasma sputtering process is used, but other gases such as Ne, Xe and $N_2$ are also used. The top surface 115 is also damaged, however, this damage is not as critical as this portion of the barrier layer is typically removed in a subsequent planarization step. The effect of this damage reduces the diffusion layer quality and degrades the overall interconnect reliability. This problem is exacerbated in advanced devices which replace the low-k dielectric (k~3.0) with ultra low-k (ULK) materials (k<3.0) as these latter materials tend to be more fragile.

Figure 2:
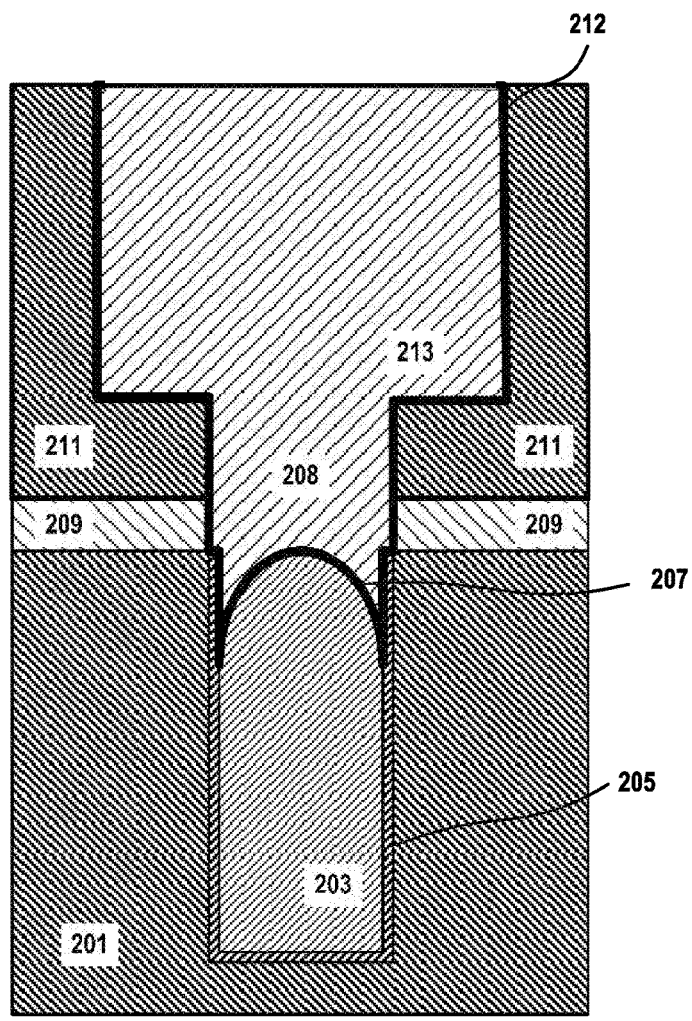
FIG. 2 is a cross-sectional diagram depicting an interconnect structure according to a first embodiment of the invention.

FIG. 2 is a cross-sectional diagram depicting an interconnect structure according to a first embodiment of the invention. As shown in the drawing, a first dielectric layer 201 is patterned to provide a recess for the first metal layer 203. In preferred embodiments, a barrier layer 205 is provided to prevent diffusion of the metal layer 203 into the dielectric layer 201. The opposite gouging feature 207 provides an increased contact area, thereby reducing the resistance of the contact with the via 208 above. In cross-section, the opposite gouging feature 207 is dome-like, extending outward or convex with respect to the first metal.

A capping layer 209 is provided on top of the first dielectric layer 201 and a second layer of dielectric 211 is formed over the capping layer 209. The second dielectric 211 is patterned using a double Damascene process to provide the recesses for the barrier layer 212 and the conductive metal that will form the via 208 and second level metal structures 213. Note that the via 208 and the barrier layer 212 form a concave structure with reference to the via material, following the convex contour of the opposite gouging feature 207 of the first level metal.

Although only a single structure at a first and second level is shown for ease in illustration, the patterned interconnection structure is usually more complicated and includes a large plurality of vias and a plurality of metal lines at a plurality of levels of the interconnect structure. The opposite gouging structure thus can be formed at any or all of the plurality of levels where vias are formed. The interconnect structure is used to electrically interconnect a plurality of semiconductor devices. Further for ease in illustration, the embedded devices are not shown but could include nFETs, pFETs and isolation dielectrics built in a semiconductor substrate. Typically, the dielectric layers 201 and 211 have respective thicknesses from 50 nm to 1200 nm with thicknesses from 80 nm to 500 nm being more preferred, but this is largely dependent on the interconnection technology used.

The dielectric layers 201, 211 are silicon dioxide in preferred embodiments, however, other dielectric materials are used in other embodiments of the invention. Further, the dielectric layers 201, 211 are multilayer structures comprising a plurality of dielectric materials in other embodiments of the invention.

The formation of the first embodiment of the interconnect structure will now be discussed in more detail in reference to FIGS. 3-7.

Figure 3:
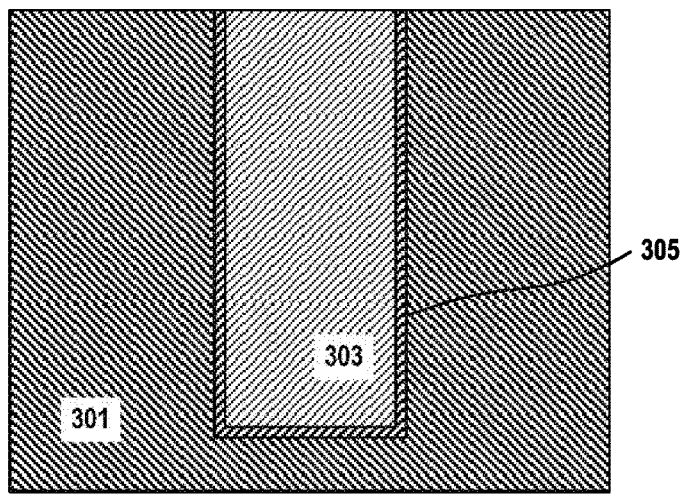
FIG. 3 is a cross-sectional diagram depicting an interconnect structure according to a first embodiment of the invention after a barrier layer and first metal layer deposition.

FIG. 3 is a cross-sectional diagram depicting an interconnect structure according to the first embodiment of the invention after patterning, barrier layer, first metal layer deposition and planarization steps have been performed. The first level dielectric layer 301 has been patterned with a feature in which the first level metal layer 303 and optionally a barrier layer 305 have been deposited. The first dielectric layer 301, e.g., SiO2, Si3N4, SiCOH, SiLK, porous dielectric, is deposited over the wafer in which the devices are fabricated (not shown). In preferred embodiments of the invention, the first dielectric layer is an ultra low-k (ULK) material (k<3.0) such as porous SiCOH or octametylcyclotetrasiloxane (OMCT).

In some embodiments, the first dielectric layer 301 may be composed of a single dielectric material. In other embodiments, the first dielectric layer 301 may be composed of at least two different dielectric materials. As is known, to form such a pattern in a dielectric, a photoresist or sacrificial mandrel layer is first patterned over the dielectric layer. A subsequent etch, e.g., a reactive ion etch (RIE) process, creates the dielectric structure depicted in FIG. 3, leaving the recess for the first level metal layer 303 and barrier layer 305.

The first level metal layer 303 and barrier layer 305 can be deposited in one or more of a variety of processes known to the art, or invented in the future. The deposition processes include, for example, chemical vapor deposition (CVD), plasma enhanced chemical vapor deposition (PECVD), physical vapor deposition (PVD) or sputtering. Typical first level metals include Cu, Al, Co, W, Ru, Ni, and alloys of the same. However, other metals can be used. Typical diffusion barrier layers include TaN, Ta, Ti, TiN, W, Ru, Ir, although other barrier layers are known to the art and are used in alternative embodiments of the invention. Where diffusion of the first level metal into the dielectric is a concern, e.g., if copper is used as the first level metal, a diffusion layer is usually used. In embodiments of the invention, the barrier layer 305 has a thickness from 1 nm to 100 nm with a thickness from 2 nm to 50 nm being more typical.

After the deposition of the first level metal layer 303 and barrier layer 305, a planarization step is used to remove the layers on the top surfaces of the field areas outside the feature resulting in the structure shown in FIG. 3. A chemical mechanical polishing (CMP) step is a widely used planarization process which is used in embodiments of the invention.

Typically, a CMP process uses an abrasive and corrosive chemical slurry (commonly a colloid) in conjunction with a polishing pad. The pad and wafer are pressed together by a dynamic polishing head and held in place by a plastic retaining ring. The field areas of the dielectric layer 301 are those areas outside the etched features of the pattern in the dielectric. Other planarization processes are known to the art and are used in alternative embodiments of the invention.

Figure 4:
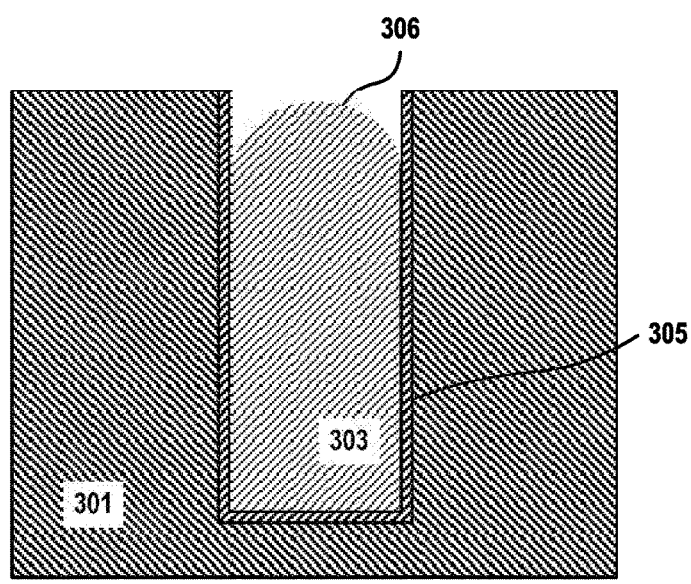
FIG. 4 is a cross-sectional diagram depicting an interconnect structure according to a first embodiment of the invention after an "opposite gouging feature" is formed in the first metal layer.

FIG. 4 is a cross-sectional diagram depicting an interconnect structure according to a first embodiment of the invention after an "opposite gouging feature" is formed in the first metal layer. A variety of processes can be used to create the convex, opposite gouging feature 306 depending on the metal used in the first metal layer. For example, a combination wet etch and reactive ion etch (RIE) process may be used for a copper layer. Where a wet etching sputtering process is performed to create the opposite-gouging feature, the wet etch chemistry includes DHF, HCl, H2SO4 or HNO3. In preferred embodiments of the invention, an angular sputtering process is used. The direction of the sputtering/etching process is at a non-perpendicular angle to the wafer surface and by controlling the angle of the etching/sputtering process a variety of protuberant feature shapes can be made. In embodiments of the invention, the sputtering direction is between 10 degrees to 80 degrees from the horizontal surface.

The sputtering/etching process is a non-selective process and all of the exposed first metal layer surface will be treated and shaped. Thus, a mask (not shown in the drawing) is applied and only exposes the area where the underlying metal layer needs to be shaped, i.e. where the via is to be fabricated. In the drawing, the mask has been removed after the sputtering/etching process.

In the first embodiment, the opposite gouging feature 306 is dome-like, although as will be discussed below other protuberant shapes are used in alternative embodiments. An objective of the invention is to increase the surface area of the first level metal to via interface. Thus, a greater degree of curvature, i.e. more rounded surface, is preferred over a slightly curved surface for a greater surface area. As is mentioned above, by angling the sputtering direction it is possible to modulate the contours of the top surface of the opposite gouging feature 306.

While the overall height of the first level metal decreases during the etch process empirical results indicate that the desired dome shape can be attained without reducing the height of the first level metal such that it interferes with the functioning of the interconnect. In preferred embodiments, the etch/sputtering process is selective to the first level metal, e.g., copper as compared to the barrier layer, e.g., TaN. As the etching rate on Cu is much faster than on Ta(N), the top portion of the barrier layer is left on the dielectric above the opposite gouging feature 306 in this embodiment.

Figure 5:
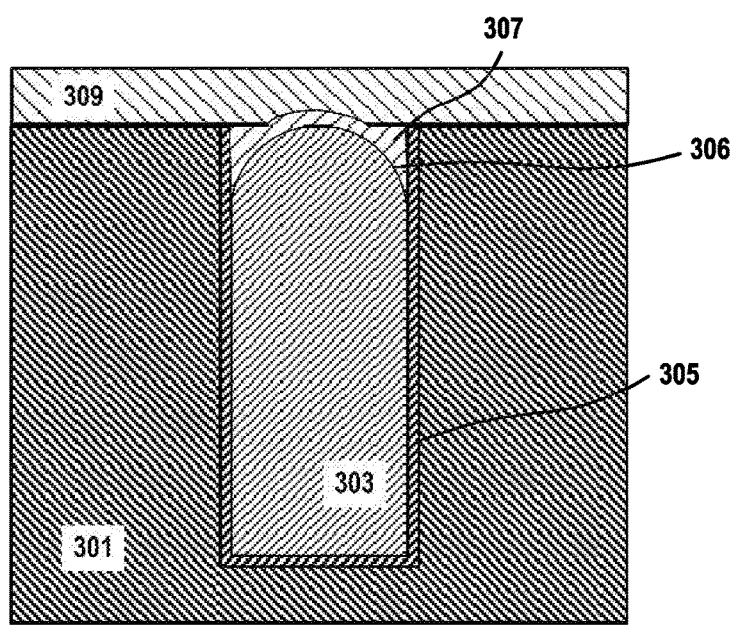
FIG. 5 is a cross-sectional diagram depicting an interconnect structure according to a first embodiment of the invention after a capping layer is formed on the "opposite gouging feature"

FIG. 5 is a cross-sectional diagram depicting an interconnect structure according to a first embodiment of the invention after a metallic capping layer and dielectric capping layer are formed on the "opposite gouging feature" and the first dielectric layer. As shown in this figure, a metallic capping layer 307 is formed over the opposite gouging feature 306. In this embodiment, a selective metal deposition process is used so that the metal cap is only deposited on the exposed conductor surface of the opposite gouging feature 306. The metals chosen for the capping layer are dependent on the metals chosen for the metal layers. For example, if the metal layers are copper or a copper alloy cobalt will give better electromigration resistance. Conventional deposition processes such as an atomic layer deposition (ALD), chemical vapor deposition (CVD), plasma enhanced chemical vapor deposition (PECVD), electroless plating to deposit the metallic capping layer 307. With greater degrees of curvature of the opposite gouging feature, an atomic layer deposition (ALD) or chemical vapor deposition (CVD) would be preferred for depositing the metal capping layer 307.

The dielectric capping layer 309, e.g., Si3N4, SiC, SiC (N,H), is formed over the first dielectric layer 301. A chemical vapor deposition (CVD), a plasma enhanced chemical vapor deposition (PECVD), a physical vapor deposition (PVD) or an atomic layer deposition (ALD) are used deposit the capping layers in different embodiments of the invention.

Figure 6:
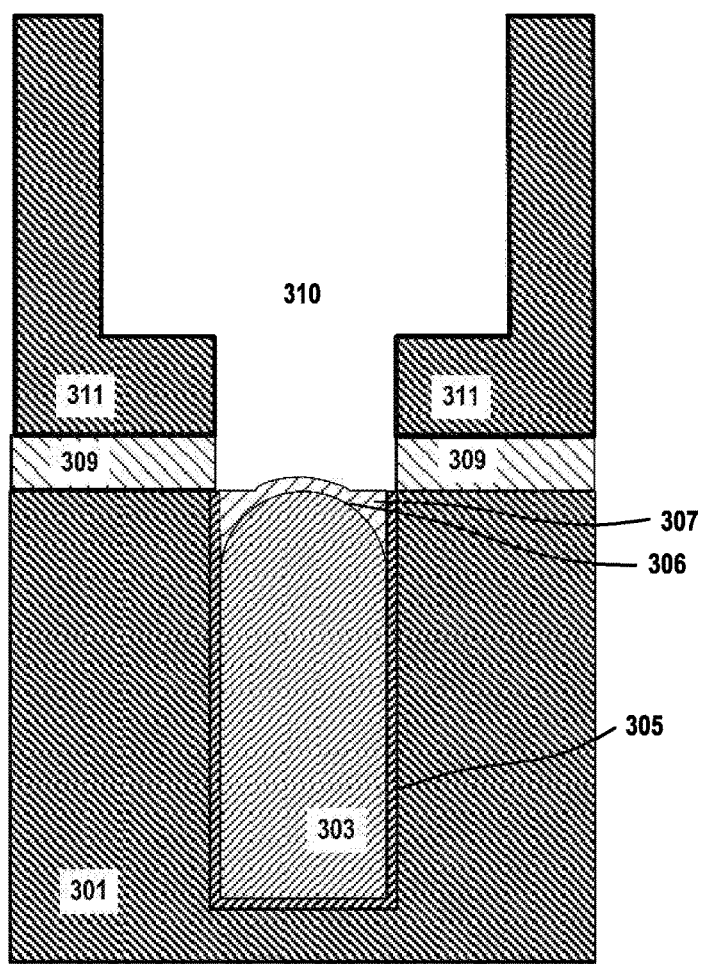
FIG. 6 is a cross-sectional diagram depicting an interconnect structure according to a first embodiment of the invention after an upper level patterning process is performed.

FIG. 6 is a cross-sectional diagram depicting an interconnect structure according to a first embodiment of the invention after an upper level patterning process is performed. A second dielectric layer 311 is deposited and then patterned to form the recess 310 for the via and second level metal. The second level dielectric material used for the second dielectric layer 311 can be similar or different from the dielectric used for the first dielectric layer 301. In preferred embodiments, this dielectric is a ULK dielectric which would have an undesirable amount of damage from the prior art via gouging process. As is known in the art, the recess is patterned using one or more lithography masks to expose the recess area and then etched using one or more etch processes such as a RIE process to form the compound recess 310. The dual Damascene process is well known in the art.

Figure 7:
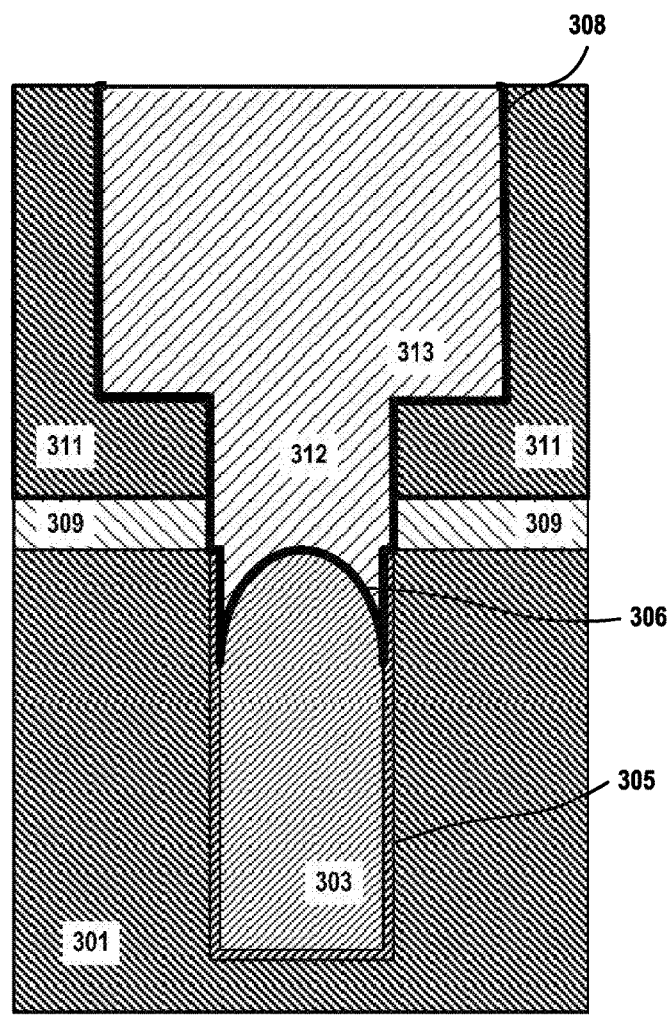
FIG. 7 is a cross-sectional diagram depicting an interconnect structure according to a first embodiment of the invention after upper level metallization and planarization processes are performed.

FIG. 7 is a cross-sectional diagram depicting an interconnect structure according to a first embodiment of the invention after barrier layer, upper level metallization and planarization processes are performed. The barrier layer 308 is the same barrier layer material chosen for barrier layer 305 in some embodiments. In other embodiments, the second barrier layer 308 is selected to be a different material. Likewise, the second metal layer which forms the via 312 and second metal line 313 is the same metal or different metal than that selected for the first metal layer 303. Suitable metal include Cu, Al, Co, W, Ru, Ni, and their alloys. Similar processes as described above can be used to deposit these layers. The thickness of the metal layers 303, 313 can vary depending on the depth of the trench and the technique used in forming the metal layer. Typically, the metal layers have an overburden thickness from 100 nm to 1200 nm, with a thickness from 300 nm to 800 nm being more typical.

As mentioned above, the barrier layer 308 and via metal 312 form a concave surface from the perspective of the via. This is the opposite shape of the via in the prior art via gouging process. The increased surface area of the opposite gouging feature 306 as compared to the original flat top surface of the first metal layer reduces the contact resistance between the via 312 and the first metal 303.

As shown in the drawing, there is an overlap of the barrier layers 305, 308 at the top periphery of the opposite gouging feature 306. The advantage of this overlap is that the first barrier layer may be damaged during the etch process that creates the opposite gouging feature. If damaged, the first barrier layer 305 might thin and not provide as good a diffusion liner as required. The second barrier layer 308 provides a backup in the case of damage to the first barrier layer 305.

Figure 8:
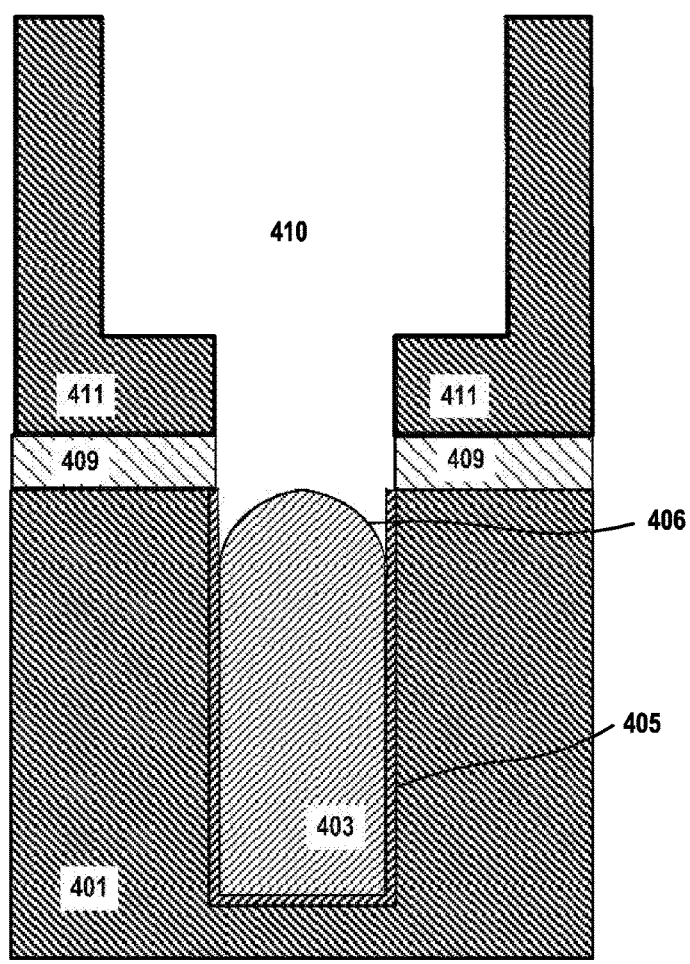
FIG. 8 is a cross-sectional diagram depicting an interconnect structure according to a second embodiment of the invention after an upper level patterning process is performed.

FIG. 8 is a cross-sectional diagram depicting an interconnect structure according to a second embodiment of the invention after an upper level patterning process is performed. As compared to the first embodiment, the optional metal capping layer is not fabricated. In this embodiment, the process is simpler, but at the disadvantage of the lack of the protective metal cap over the opposite gouging feature 406 of the first metal layer when the recess 410 for the via and second metal layer are formed. When a copper conductor is used and capped with a preferred metal, e.g., Co, the interconnect has a better electromigration resistance. Thus, a capping layer is preferred for a high-end product which requires a higher reliability performance.

Figure 9:
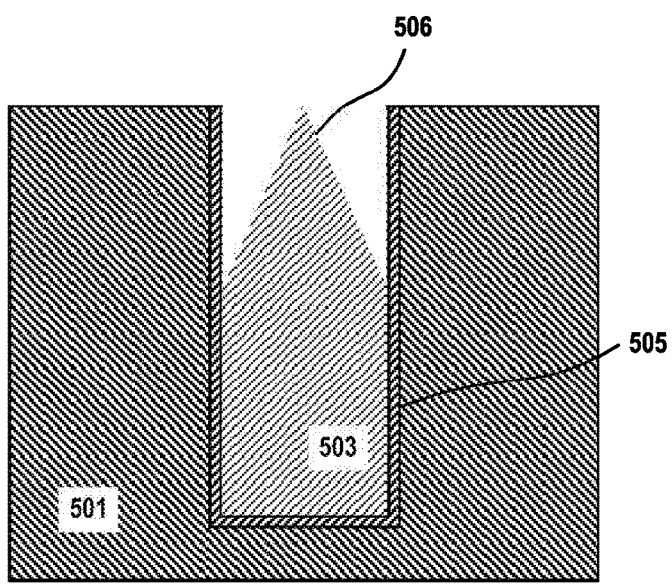
FIG. 9 is a cross-sectional diagram depicting an interconnect structure according to a third embodiment of the invention after a conical "opposite gouging feature" is created.

FIG. 9 is a cross-sectional diagram depicting an interconnect structure according to a third embodiment of the invention after a conical "opposite gouging feature" 506 is created. In the third embodiment, a different type of protuberant feature is created. As compared to the first embodiment, the conical feature 506 has a greater surface area than the dome shape, but with the disadvantage of some extra metal in the first metal line 503. A difference in processing is used to get the different shapes in the opposite gouging features, e.g., changing the angle of etch/sputtering. The different geometries have different performances which are related to the amount of surface area increase as well as the nominal height of the first metal line.

Figure 10:
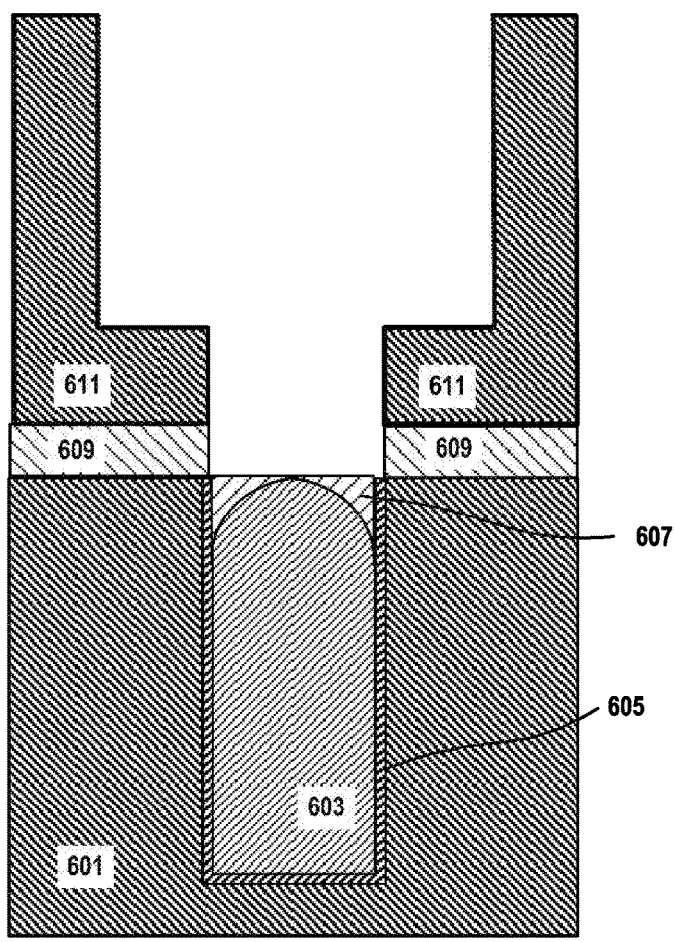
FIG. 10 is a cross-sectional diagram depicting an interconnect structure according to a fourth embodiment of the invention after an upper level patterning process is performed.

FIG. 10 is a cross-sectional diagram depicting an interconnect structure according to a fourth embodiment of the invention after an upper level patterning process is performed. In this embodiment, the metal capping layer 607 is deposited over the entire surface of the substrate and the excess material in the field areas is removed via a CMP or other planarization process. The fourth embodiment is advantageous as compared to the first embodiment when the material to be used for the capping layer cannot be deposited selectively in the manner of the first embodiment. Depending on how much the first level metal has been reduced in height by the opposite gouging feature, it can be less protective of the opposite gouging feature 606 at the very center of the capping layer.

This figure can also represent the case where the metal cap experiences some loss in thickness during the via patterning process. This is in comparison to the first embodiment in which there is no damage during the via patterning and no metal cap loss. Like the first embodiment, the capping metal is used to improve the characteristics of the interconnect, e.g., the mentioned Cu conductor capped with a preferred metal cap, e.g., Co, which creates a better electromigration resistance for a high-end product which requires a higher reliability performance.

Figure 11:
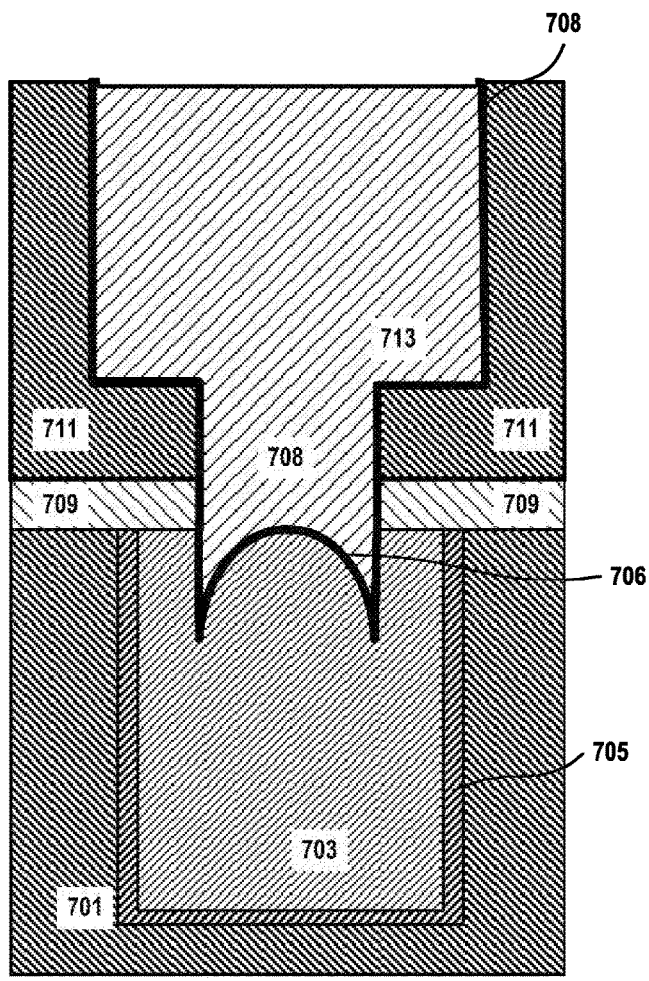
FIG. 11 is a cross-sectional diagram depicting an interconnect structure according to a fifth embodiment of the invention after upper level metallization and planarization processes are performed.

FIG. 11 is a cross-sectional diagram depicting an interconnect structure according to a fifth embodiment of the invention after upper level metallization and planarization processes are performed. In the prior embodiments, the first level metal is the same width as the via. In the fifth embodiment, the first level metal 703 is wider than the via 708 and has a width comparable to the second metal level 713. In this embodiment, a hard mask is deposited before the sputtering/etching step that makes the opposite gouging feature 706. In the prior embodiments, the relatively narrow first level metal can be deposited at a greater height so that the overall cross-section of the first level metal is equivalent. Where increasing the height of the first metal layer is not practical, the fifth embodiment in which a wider first metal line is used.

Because the via size is smaller in the horizontal direction than the underlying metal layer 703, structure shown in FIG. 11 has a better overlay tolerance between the via and the underlying metal layer 703 as compared to the structure depicted in FIG. 10. However, as compared to the FIG. 10 structure, a deeper or/and a more curved surface in the opposite gouging feature 706 can be created in the FIG. 11 structure to compensate for the contact area loss in embodiments where the via has a smaller horizontal dimension (as compared to the horizontal dimension of the via in FIG. 10 structure).

As is known to the art, the interconnect structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

Although the figures show only two levels for ease in illustration, in an actual device there can be more levels of the interconnection structure.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an interconnect structure for an integrated circuit device comprising:
   providing a first dielectric layer on a substrate, the first dielectric layer having a first level metal line therein;
   creating an opposite gouging feature in a top surface of the first level metal line, the opposite gouging feature having a protuberant shape relative to the first level metal line;
   forming a second dielectric layer over the first dielectric layer; and
   forming a compound recess in the second dielectric layer, a first portion of the recess for a via connector positioned over the opposite gouging feature and a second portion of the recess for a second level metal line.

2. The method as recited in claim 1, further comprising forming a metal cap over the opposite gouging feature.

3. The method as recited in claim 1, further comprising depositing a second metal layer in the compound recess forming the via connector and the second level metal line, wherein the via connector has a concave profile with respect to the second metal layer over the opposite gouging feature.

4. The method as recited in claim 3, further comprising:
   forming a first barrier layer between the first dielectric layer and the first level metal; and
   forming a second barrier layer over the opposite gouging feature;
   wherein the second barrier layer overlaps the first barrier layer over a portion of the first dielectric layer at a periphery of the opposite gouging feature.

5. The method as recited in claim 1, wherein the opposite gouging feature has a dome-like profile.

6. The method as recited in claim 1, wherein the opposite gouging feature has a conical profile.

7. The method as recited in claim 1, wherein an angular sputtering process is performed to create the opposite-gouging feature.

8. The method as recited in claim 7, wherein the sputtering direction is between 10 degrees to 80 degrees from the horizontal surface.

9. The method as recited in claim 1, wherein a wet etching sputtering process is performed to create the opposite-gouging feature.

* * * * *